(12) United States Patent
Cha et al.

(10) Patent No.: US 7,697,341 B2
(45) Date of Patent: Apr. 13, 2010

(54) METHOD OF TESTING A NON-VOLATILE MEMORY DEVICE

(75) Inventors: Jae Won Cha, Seoul (KR); Duck Ju Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 92 days.

(21) Appl. No.: 12/136,798

(22) Filed: Jun. 11, 2008

(65) Prior Publication Data

US 2009/0231927 A1    Sep. 17, 2009

(30) Foreign Application Priority Data

Mar. 14, 2008    (KR) .................. 10-2008-0023838

(51) Int. Cl.
*G11C 16/06* (2006.01)

(52) U.S. Cl. .................. 365/185.22; 365/185.29; 365/185.12; 365/185.21; 365/185.17

(58) Field of Classification Search ............ 365/185.29, 365/185.21–185.22, 185.03, 185.12, 185.17–185.18
See application file for complete search history.

(56) References Cited

U.S. PATENT DOCUMENTS 6,813,184 B2    11/2004 Lee
7,403,424 B2 *    7/2008 Hemink et al. ......... 365/185.22

FOREIGN PATENT DOCUMENTS

KR    1020060060387 A    6/2006

* cited by examiner

*Primary Examiner*—David Lam
(74) *Attorney, Agent, or Firm*—Townsend and Townsend and Crew LLP

(57) ABSTRACT

A method of testing a non-volatile memory device on a wafer is disclosed. The method includes performing an erase operation and a first verify operation about every memory cell in the non-volatile memory device, storing data of a first latch in a page buffer for storing result in accordance with the first verify operation in a second latch, and setting the data of the first latch to data indicating pass of the verifying, and performing a soft program and a second verify operation about every memory cell.

12 Claims, 5 Drawing Sheets

METHOD OF TESTING A NON-VOLATILE MEMORY DEVICE

CROSS-REFERENCE TO RELATED APPLICATIONS

This application claims priority from Korean Patent Application No. 2008-23838, filed on Mar. 14, 2008, the contents of which is incorporated herein by reference in its entirety.

BACKGROUND OF THE INVENTION

The present invention relates to an erase method in a non-volatile memory device. More particularly, the present invention relates to a method of testing a non-volatile memory device for enhancing threshold voltage distribution characteristics after an erase operation is performed for a multi level cell (MLC) memory device.

Generally, a flash memory device as a non-volatile memory device is divided into a NAND flash memory device and a NOR flash memory device.

In the NOR flash memory, each of the memory cells are connected independently to a bit line and a word line, and so the NOR flash memory has excellent random access time. Whereas, in the NAND flash memory, only one contact is required for one cell string because memory cells are connected in series, and so the NAND flash memory has excellent characteristics for integration. Accordingly, the NAND flash memory has been generally employed in high density flash memory.

The well-known NAND flash memory device includes a memory cell array, a row decoder and a page buffer.

The memory cell array has word lines disposed along rows, bit lines disposed along columns, and cell strings corresponding to each of the bit lines.

Recently, multi bit cells for storing a plurality of data bits in one memory cell has been actively studied so as to increase the degree of integration of the above flash memory. This memory cell is referred to as a multi level cell (hereinafter, referred to as "MLC"). A memory cell for storing one data bit is referred to as a single level cell (SLC).

The MLC has a plurality of threshold voltage distributions so as to store a plurality of data. This means that the possible data values are stored differently in accordance with each of the cell distribution voltages.

The flash memory device is manufactured on a wafer. Here, a memory cell having a fail, i.e. a failed memory cell in accordance with a test process is masked on the wafer, and then a repair process is performed about the failed memory cell by using a laser.

FIG. 1 is a flow chart illustrating a common process of testing a memory cell on a wafer.

In FIG. 1, in the case that a test is started on the wafer, a power source test, for verifying whether or not a power source is normally applied to each of memory chips, is performed in step S101.

In step S103, every memory cell on the wafer is erased when the power source test is finished. The memory cells on the wafer may have different threshold voltages during a manufacturing process. Accordingly, every memory cell is erased so that the memory cells have threshold voltages of less than 0V.

In step S105, a hard erase verify is performed so as to verify whether or not every memory cell has a threshold voltage of less than 0V in accordance with the above erase process.

In the case that a fail has occurred to a specific memory cell in accordance with results of the hard erase verify in step S107, the test operation is stopped in step S109.

In step S111, data in the failed memory cell are read, and information related to the read data is stored in a corresponding page buffer.

In step S113, a failed page buffer is determined in accordance with the stored information, masking data are inputted to the page buffer connected to the memory cell so that a latch in the failed page buffer outputs a pass signal in a following operation.

In step S115, every memory cell is erased again after the masking data are inputted to the page buffer, and then it is verified whether or not the masking is normally performed through the hard erase verify. Generally, since the masking is normally performed in the steps S111 and S113, the hard erase verify is passed.

In step S117, a soft program is performed so that the memory cells have a threshold voltage near 0V in the case that the hard erase verify is finished. Particularly, in the case that the threshold voltage of the memory cell is much smaller than 0V when programming the memory cell, a programming time is long and the memory cell may affect other memory cells. Accordingly, the memory cells are pre-programmed so that the memory cells have a threshold voltage near 0V.

In step S119, verifying the soft program is performed by using a soft verify voltage SEV.

As described above, in the case that a failed memory cell has occurred during the test process, the test process is stopped, the information concerning the failed memory cell is stored, and masking is performed about the failed memory cell. Then, every memory cell is erased, and the hard erase verify is performed. As a result, a test time becomes longer.

FIG. 2A to FIG. 2C are views illustrating the threshold voltage shifts of the memory cells in accordance with the operation in FIG. 1.

The memory cells on a wafer may have various threshold voltages at an initial time. In FIG. 2A, every memory cell is erased in step S103 so that the memory cells have a threshold voltage of less than 0V. Here, the hard erase verify is performed by using a hard verify voltage EV.

FIG. 2A to FIG. 2C show a process of shifting the threshold voltages of the memory cells having a wide threshold voltage distribution so that the memory cells can have a narrow threshold voltage distribution near 0V.

In FIG. 2B and FIG. 2C, the soft program is performed so that the memory cells have threshold voltages near 0V. Then, a verify is performed by using the soft verify voltage SEV to determine if the memory cells threshold voltages near the soft verifying voltage SEV.

In the case where the process of erasing every memory cell and the hard erase verify are performed in the test process, a failed memory cell usually occurs. Hence, a process of inputting the masking data to corresponding page buffer is required before following the soft program and the verify process are performed so that the hard verify is passed. Accordingly, a time for testing the wafer is increased due to the process of inputting the masking data.

SUMMARY OF THE INVENTION

The present invention relates to a method of testing a non-volatile memory device, in which a masking step about a failed bit line is not performed when the memory device are tested on a wafer.

A method of testing a non-volatile memory device on a wafer according to one example embodiment of the present invention includes performing an erase operation and a first verify operation about every memory cell in the non-volatile memory device; storing data of a first latch in a page buffer for storing result in accordance with the first verify operation in a second latch, and setting the data of the first latch to data indicating pass of the verify operation; and performing a soft program and a second verify operation about every memory cell.

A first verify voltage for the first verify operation is smaller than a second verify voltage for the second verify operation.

An operation of testing power source is performed before the erase operation is performed.

The step of setting includes providing the data of the first latch for storing the result in accordance with the first verify operation to the second latch; and converting the data of the first latch into the data indicating pass of the verify operation.

The data provided to the second latch is inverted and the inverted data is transmitted to a sense node of corresponding page buffer so as to convert the data of the first latch into the data indicating pass of the verify operation, and the data of the first latch is converted in accordance with voltage level of the sense node.

The second verify operation is stopped in case that at least on of the memory cells is passed.

A method of testing a non-volatile memory device on a wafer according to another example embodiment of the present invention includes performing an erase operation about every memory cell in the non-volatile memory device and a first verify operation using a first latch in corresponding page buffer; transmitting data stored in the first latch to a second latch in the page buffer through a sense node in the page buffer; setting data of the second latch to data indicating verify pass result; and performing a soft program and a second verify operation about the memory cells.

A process of testing power source is performed before the erase operation is performed.

The data of the second latch is transmitted to the first latch through the sense node so as to set the data indicating the verify pass result to the second latch.

A first verify voltage for the first verify operation is smaller than a second verify voltage for the second verify operation.

A repair operation is performed by using the data of the first latch in accordance with the step of transmitting.

The second verify operation is stopped in case that at least one of the memory cells is passed.

As described above, a method of testing a non-volatile memory device of the present invention does not perform a masking operation about a failed bit line when the memory device is tested on a wafer, thereby reducing a time for the testing.

DESCRIPTION OF SPECIFIC EMBODIMENTS

Hereinafter, the embodiments of the present invention will be explained in more detail with reference to the accompanying drawings.

Figure 1:
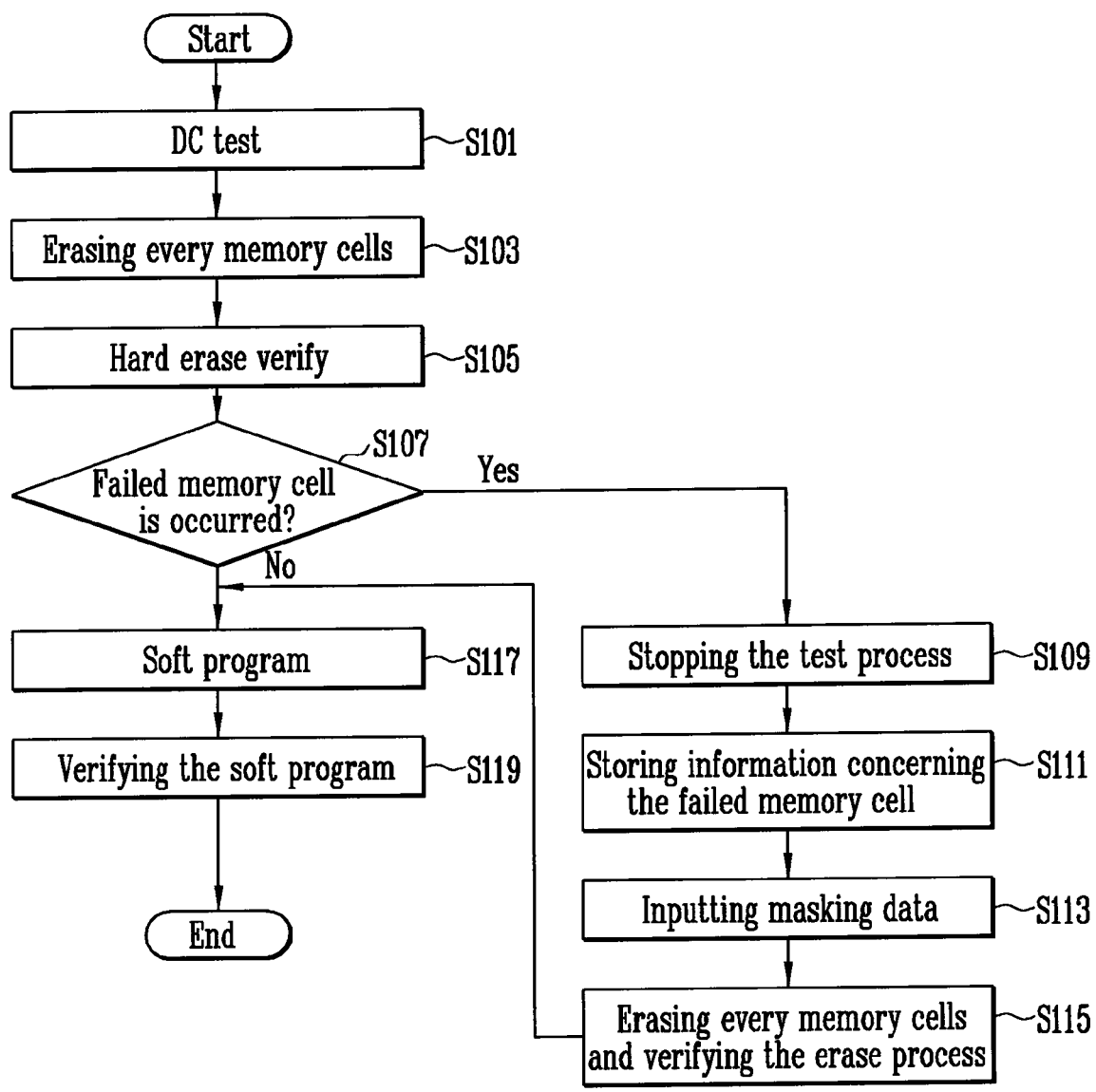
FIG. 1 is a flow chart illustrating a common process of testing a memory cell on a wafer.
Figure 2A:
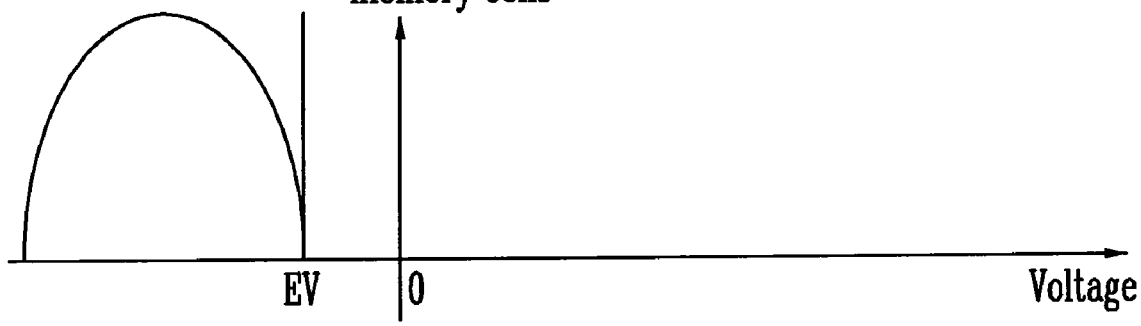
FIG. 2A to FIG. 2C are views illustrating the threshold voltage shift of the memory cells in accordance with the operation in FIG. 1.
Figure 2B:
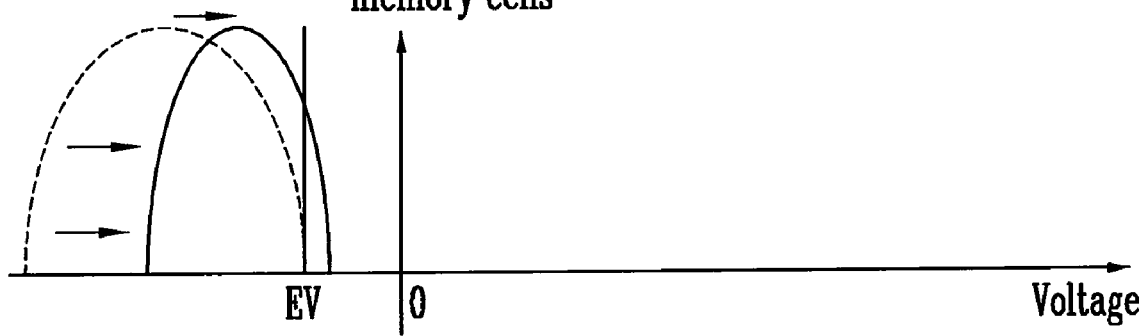
Figure 2C:
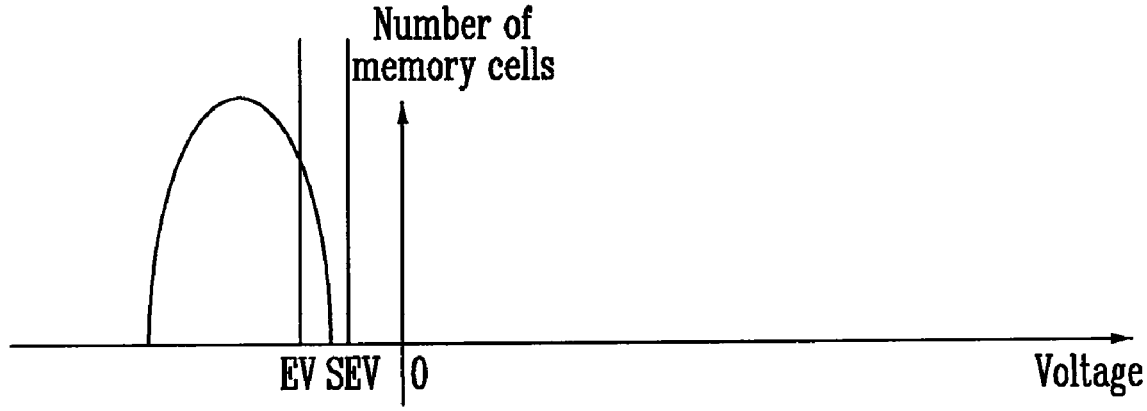
Figure 3A:
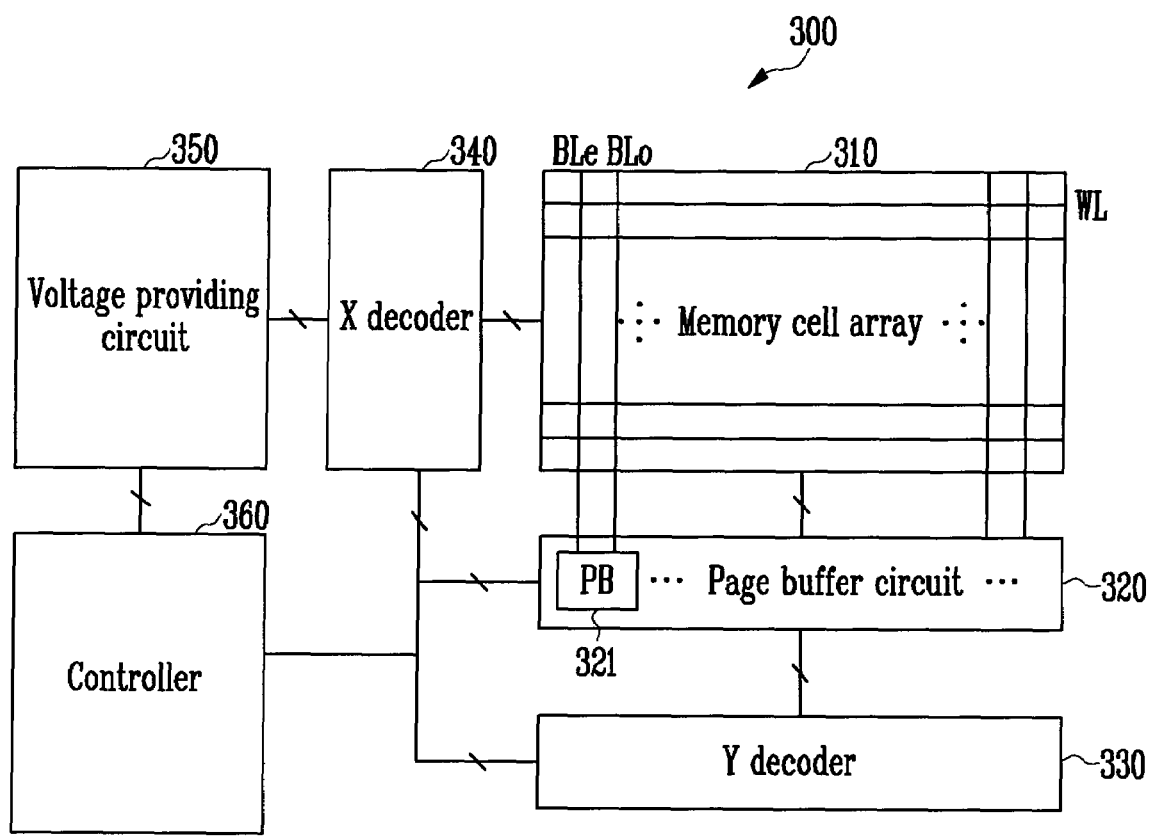
FIG. 3A is a block diagram illustrating a flash memory device.

FIG. 3A is a block diagram illustrating a flash memory device.

In FIG. 3A, the flash memory device 300 includes a memory cell array 310, a page buffer circuit 320, a Y decoder 330, a X decoder 340, a voltage providing circuit 350 and a controller 360.

The memory cell array 310 has a plurality of cell strings in which memory cells for storing data are coupled in series. Here, each of the cell strings is coupled to a corresponding bit line BL. In addition, gates of the memory cells vertical to the bit line BL are coupled to word lines WL. In one embodiment, the memory cell array has a plurality of memory cell blocks, where each memory cell block has a plurality of cell strings.

The page buffer circuit 320 includes a plurality of page buffers 321. Each page buffer 321 is coupled to a given number of bit lines of the memory cell array 310. In one implementation, the page buffer 321 is coupled to a pair of bit lines. In other implementation, the page buffer 321 may be coupled to only one bit line or three bit lines or more. The page buffer 321 is configured to temporarily store data to be programmed in a selected memory cell and then provide the data to the selected memory cell through a corresponding bit line BL, or read data stored in a memory cell and temporarily store the read data to be outputted to an external node.

The page buffer 321 has latch circuits. Here, one latch circuit may receive data to be cache-programmed while a program operation is performed by using another latch circuit.

The Y decoder 330 provides an input/output path to the page buffer 321 of the page buffer circuit 320 in accordance with an input address.

The X decoder 340 selects a word line of the memory cell array 310 in accordance with the input address.

The voltage providing circuit 350 generates an operation voltage to be provided to the word line selected by the X decoder 340 in accordance with control of the controller 360.

The controller 360 outputs a control signal in accordance with an operation command, and controls the voltage providing circuit 350 so that a preset pass voltage is provided in accordance with a data program step of the memory cell array 310.

Hereinafter, the page buffer 321 included in the page buffer circuit 320 will be described in detail.

Figure 3B:
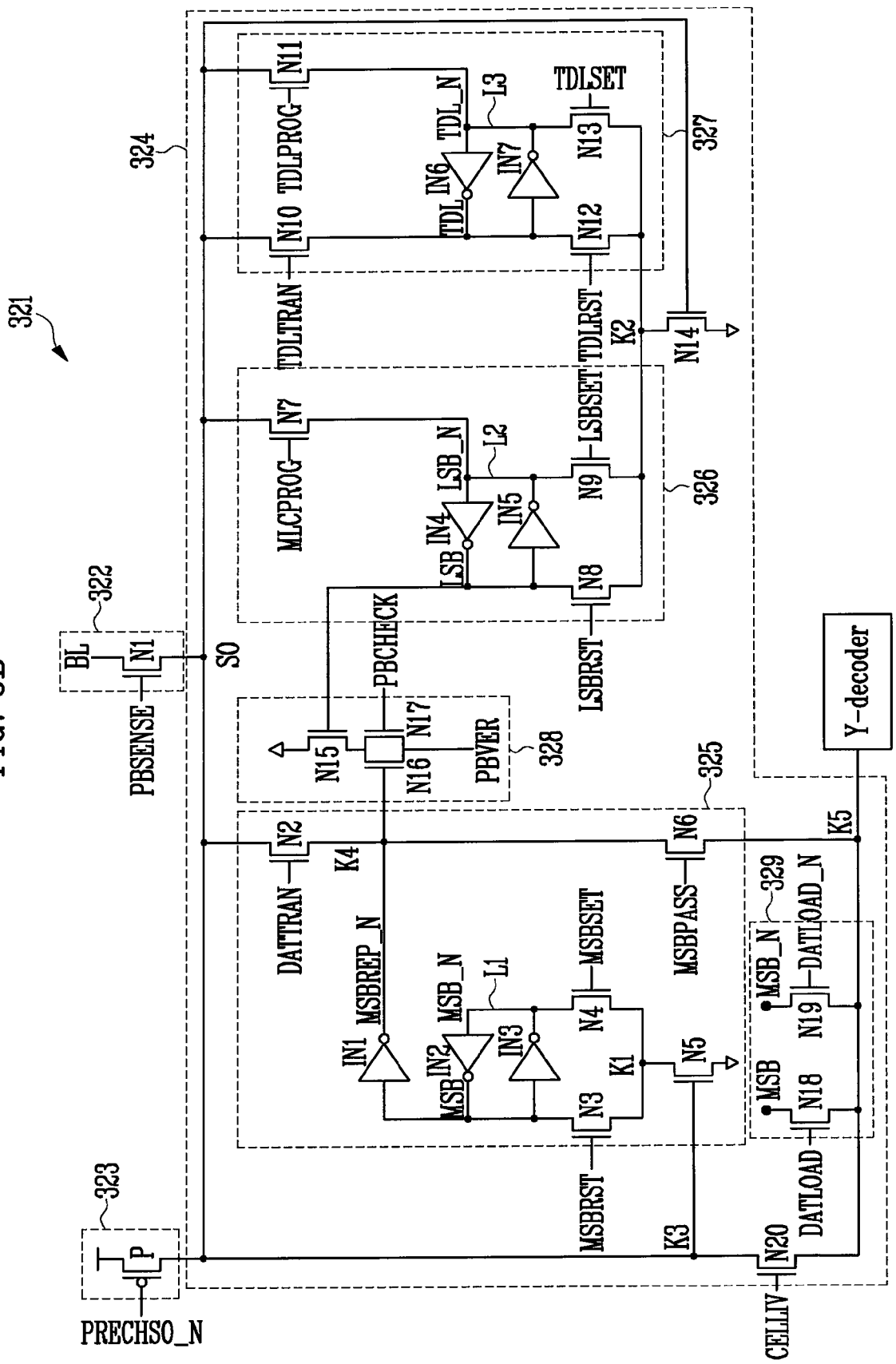
FIG. 3B is a view illustrating circuitry of the page buffer in FIG. 3A.

FIG. 3B is a view illustrating circuitry of the page buffer in FIG. 3A.

In FIG. 3B, the page buffer 321 includes a sensing circuit 322, a precharge circuit 323, a latch circuit 324, a verify circuit 328 and a data input circuit 329.

The page buffer 321 is associated with a given number of bit lines, e.g., two. A bit line select circuit (not shown) connects the page buffer 321 to a bit line selected for an operation.

The sensing circuit 322 is coupled to the selected bit line, and is turned on or off in accordance with a voltage level of the bit line and voltage level of a sense node SO.

The precharge circuit 323 precharges the sense node SO.

The latch circuit 324, which has a first to third sub-latch circuits 325 to 327, stores data to be programmed and then provides the stored data to the bit line through the sense node SO, or reads data from the memory cells in accordance with the voltage level of the bit line and then stores the read data.

The verify circuit 328 is coupled between the first sub-latch circuit 325 and the second sub-latch circuit 326, and outputs a verify signal PBVER related to a program verify.

The data input circuit 329 is coupled to the first sub-latch circuit 325, and inputs data into the first sub-latch circuit 325 in accordance with the control signal.

The sensing circuit 322 includes a first N-MOS transistor N1.

The precharge circuit 323 has a P-MOS transistor P.

The first sub-latch circuit 325 includes a second N-MOS transistor N2 to a sixth N-MOS transistor N6, and a first inverter IN1 to a third inverter IN3.

The second sub-latch circuit 326 has a seventh N-MOS transistor N7 to a ninth N-MOS transistor N9, a fourth inverter IN4 and a fifth inverter IN5.

The third sub-latch circuit 327 includes a tenth N-MOS transistor N10 to a thirteenth N-MOS transistor N13, a sixth inverter IN6 and a seventh inverter IN7.

The latch circuit 324 further includes a fourteenth N-MOS transistor N14 and a twentieth N-MOS transistor N20.

The verify circuit 328 has a fifteenth N-MOS transistor N15 to a seventeenth N-MOS transistor N17.

The data input circuit 329 includes an eighteenth N-MOS transistor N18 and a nineteenth N-MOS transistor N19.

The first N-MOS transistor N1 is coupled between the bit line (or bit line select circuit) and the sense node SO. Here, a sensing control signal PBSENSE is transmitted to a gate of the first N-MOS transistor N1.

The P-MOS transistor P is coupled between a power source and the sense node SO. Here, a precharge control signal PRECHSO_N is transmitted to a gate of the P-MOS transistor P.

The second N-MOS transistor N2 is coupled between the sense node SO and a node K4. Here, a data transmission control signal DATTRAN is transmitted to a gate of the second N-MOS transistor N2.

The third N-MOS transistor N3 is coupled between a node MSB and a node K1, and the fourth N-MOS transistor N4 is coupled between a node MSB_N and the node K1. Here, a first reset signal MSBRST is provided to a gate of the third N-MOS transistor N3, and a first set signal MSBSET is transmitted to a gate of the fourth N-MOS transistor N4.

The fifth N-MOS transistor N5 is coupled between the node K1 and a ground node. Here, the sense node SO is coupled to a gate of the fifth N-MOS transistor N5.

The first inverter IN1 which is coupled between the node K4 and the node MSB, inverts a status of the node MSB, and outputs the inverted result to the node K4.

The second inverter IN2 and the third inverter IN3 form a first latch between the node MSB and the node MSB_N.

The sixth N-MOS transistor N6 is coupled between the node K4 and a node K5. Here, a data output control signal MSBPASS is inputted to a gate of the sixth N-MOS transistor N6.

The seventh N-MOS transistor N7 is coupled between the sense node SO and a node LSB_N. Here, an MLC program control signal MLCPROG is inputted to a gate of the seventh N-MOS transistor N7.

The fourth inverter IN4 and the fifth inverter IN5 form a second latch L2 between a node LSB and the node LSB_N.

The eighth N-MOS transistor N8 is coupled between the node LSB and a node K2, and the ninth N-MOS transistor N9 is coupled between the node LSB_N and the node K2. Here, a second reset signal LSBRST is transmitted to a gate of the eighth N-MOS transistor N8, and a second set signal LSBSET is inputted to a gate of the ninth N-MOS transistor N9.

The tenth N-MOS transistor N10 is coupled between the sense node SO and a node TDL, and the eleventh N-MOS transistor N11 is coupled between the sense node SO and a node TDL_N. Here, a control signal TDLTRAN is inputted to a gate of the tenth N-MOS transistor N10, and a control signal TDLPROG is provided to a gate of the eleventh N-MOS transistor N11.

The sixth inverter IN6 and the seventh inverter IN7 form a third latch L3 between the node TDL and the node TDL_N.

The twelfth N-MOS transistor N12 is coupled between the node TDL and the node K2, and the thirteenth N-MOS transistor N13 is coupled between the node TDL_N and the node K2. Here, a third reset signal RDLRST is inputted to a gate of the twelfth N-MOS transistor N12, and a third set signal TDLSET is transmitted to a gate of the thirteenth N-MOS transistor N13.

The fourteenth N-MOS transistor N14 is coupled between the node K2 and a ground voltage. Here, the sense node SO is coupled to a gate of the fourteenth N-MOS transistor N14.

The fifteenth N-MOS transistor N15 and the sixteenth N-MOS transistor N16 are coupled in series between the ground node and a node related to the verify signal PBVER.

The seventeenth N-MOS transistor N17 is coupled to a common drain and source of the sixteenth N-MOS transistor N16.

A gate of the fifteenth N-MOS transistor N15 is coupled to the node LSB, and a gate of the sixteenth N-MOS transistor N16 is coupled to the node K4. A page buffer check signal PBCHECH is inputted to a gate of the seventeenth N-MOS transistor N17.

The twentieth N-MOS transistor N20 is coupled between the sense node SO and the node K5. Here, a control signal CELLIV is inputted to a gate of the twentieth N-MOS transistor N20.

The eighteenth N-MOS transistor N18 is coupled between the node MSB and the node K5, and the nineteenth N-MOS transistor N19 is coupled between the node MSB_N and the node K5. Here, a data input control signal DATLOAD is inputted to a gate of the eighteenth N-MOS transistor N18, and an inverted signal DATLOAD_N of the data input control signal DATLOAD is transmitted to a gate of the nineteenth N-MOS transistor N19.

Hereinafter, a test method for the flash memory device having the above page buffer 321 will be described in detail.

Figure 4A:
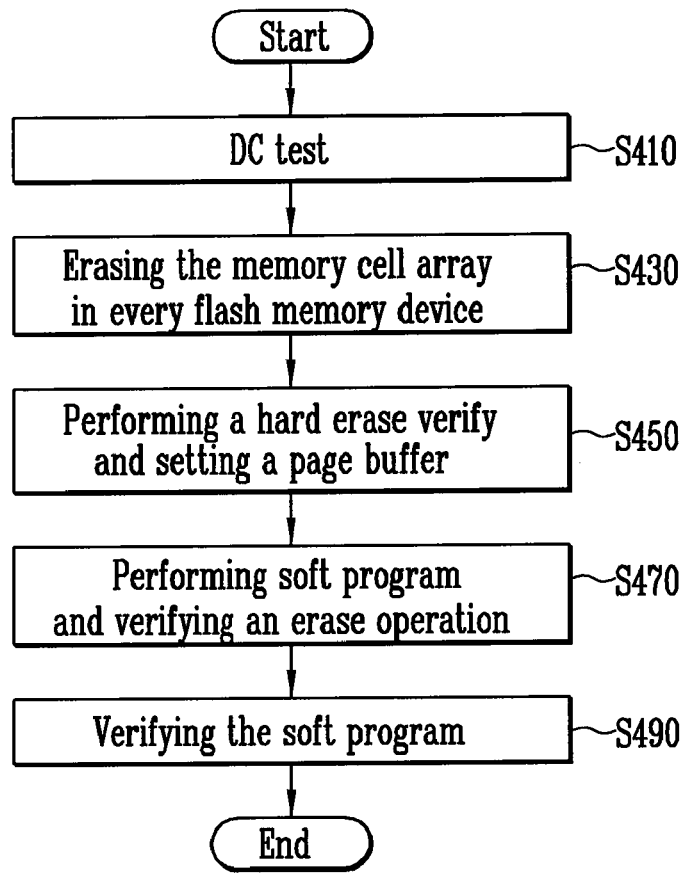
FIG. 4A is a flow chart illustrating a test process in the flash memory device according to one example embodiment of the present invention.

FIG. 4A is a flow chart illustrating a test process in the flash memory device according to one embodiment of the present invention.

In FIG. 4A, in the case that a test is started on the wafer, a power source test for flash memory devices 300 on the wafer is performed in step S410. That is, the test is performed prior to dicing the wafer into a plurality of dice or chips in the present embodiment. In another embodiment, the test may be done after the wafer has been diced.

In step S430, a chip-wide erase operation is performed on all of the memory cells in the flash memory device 300, not just a given sector or block in the memory cell arrays 310.

Memory cells included in the memory cell array 310 may have different threshold voltages due the manufacture process variation. The memory cells are erased so that all of them are provided to have threshold voltages of less than 0V. However, partly due to the manufacture process variation, one or more cells may not have been erased properly, i.e., their threshold voltages are not lowered to less than 0V.

In step S450, an erase verify for the erase operation is performed by using a hard verify voltage EV. The data obtained during the hard verify step is stored in the page buffer 321 to determine whether or not all of the memory cells associated with the page buffer 321 have been erased.

The hard erase verify is performed by scanning the bit lines coupled to the memory cells.

If one or more memory cells have threshold voltages greater than the hard verify voltage EV, it is determined that a fail has occurred to the corresponding bit line (or cell string). This will be described in more detail with reference to a circuitry of the page buffer 321.

The hard verify voltage EV is applied to all of the word lines associated with a memory cell block so as to perform the hard erase verify a memory cell block at a time.

The hard erase verify may done a number of differently ways, e.g., a block at a time, or the entire cell array at the same time. Then, the hard erase verify is performed by reading the voltage applied to the node LSB_N of the second latch L2 via the sensing circuit 322.

To perform the hard erase verify, the page buffer 321 is initialized so that the node LSB_N is at "1," and the sense node SO is precharged to a high level in accordance with the precharge control signal PRECHSO_N.

Subsequently, the first N-MOS transistor N1 is turned on by applying the sensing control signal PBSENSE having a high level. The hard verify voltage EV is applied at this time to the word lines associated with the bit line.

If all the memory cells coupled to the bit line that is connected to the page buffer 321 have threshold voltages less than the hard verify voltage EV (i.e., if the erase operation has been performed successfully), all of the memory cells are turned on when the hard verify voltage EV is applied to their gates, and thus the path to the common source is opened. Hence, a precharged high level voltage of the sense node SO is discharged to a common source line. Accordingly, the sense node SO goes from a high voltage level ("1") to a low voltage level ("0"). The fourteenth N-MOS transistor is turned off since its gate is coupled to the sense node SO. The node LSB_N remains at "1."

However, if at least one of the memory cells coupled to the bit line that is connected to the page buffer 321 has a threshold voltage higher than the hard verify voltage EV, that memory cell remains turned off and the path to the common source is blocked. Accordingly, the precharged high level voltage of the sense node SO is not discharged. The sense node SO remains at a high level, and thus the fourteenth N-MOS transistor N14 is turned on. Here, in the case that status of the sense node SO is read to the node LSB_N by using the second set signal LSBSET, the node LSB_N converts to data "0". This indicates that the bit line to the sensing circuit 322 has a memory cell that has not been erased properly, i.e., has a failed cell.

This fail is communicated to the first latch L1 after the status of the sense node SO is read to the node LSB_N. Other page buffers 321 in the page buffer circuit 320 performs the above steps in parallel. All these page buffers 321 are instructed to output the pass signals by setting again the node LSB_N as data "1." This process of setting the page buffer 321 will be described in detail with reference to FIG. 4B.

In step S470, a soft program and an erase verify operation are performed because every page buffer 321 outputs the pass signal at step 450.

In step S490, a verify operation for the soft program is performed. Then, the test process is finished.

Hereinafter, the above step S450 will be described in detail.

Figure 4B:
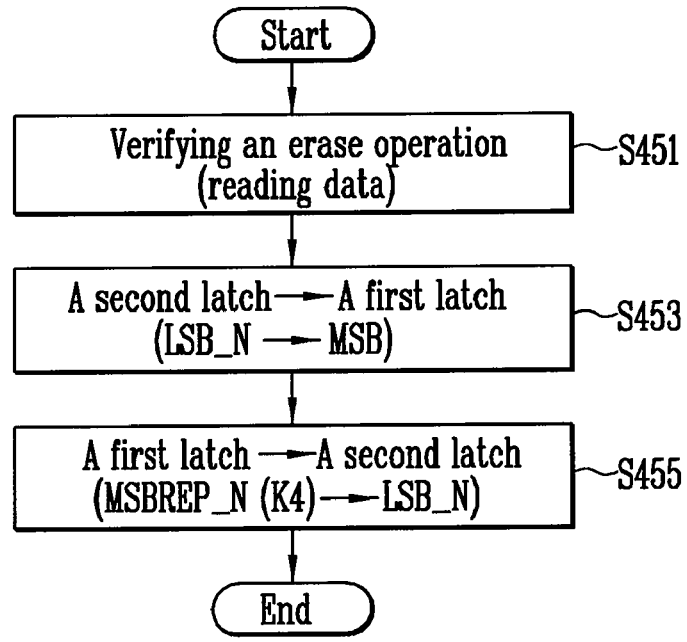
FIG. 4B is a flow chart illustrating the hard erase verify and the operation of setting the page buffer in FIG. 4A.

FIG. 4B is a flow chart illustrating the hard erase verify and the operation of setting the page buffer in FIG. 4A.

In FIG. 4B, in step S451, the data as to whether or not a cell string has a failed cell is transmitted to the node LSB_N of the page buffer 321, as described in step S450 in FIG. 4A.

As mentioned above, the node LSB_N of the page buffer 321 has data "o" when the cell string (or bit line) has a failed cell. If the cell string has no failed cell, the node LSB_N of the page buffer 321 has data "1."

In step S453, the data of the node LSB_N and second latch L2 is transmitted to the node MSB_N of the first latch L1.

To be more specific, the node MSB_N of the first latch L1 is initialized to have data "1," and the MLC program control signal MLCPROG having a high level is transmitted to the seventh N-MOS transistor N7. As a result, the seventh N-MOS transistor N7 is turned on, and so the voltage level of the sense node SO is changed in accordance with that of the node LSB_N. That is, if the node LSB_N has "1" (or high voltage level), the sense node SO has "1." If the node LSB_N has "0" (or low voltage level), the sense node SO has "0."

The gate of the fifth N-MOS transistor N5 is coupled to the sense node SO. Accordingly, the fifth N-MOS transistor N5 is turned on if the sense node SO has "1" or turned off if the sense node has "0."

The first set signal MSBSET having a high level is transmitted to the fourth N-MOS transistor N4, and the fourth N-MOS transistor N4 is turned on. In this case, the inverse of the data of the node LSB_N is inputted to the node MSB_N. In other words, the node MSB_N has data "0" if the node LSB_N has data "1," (i.e. a pass), and has data "1" if the node LSB_N has data "0," (i.e. a fail).

In step S455, after transmitting the data from the second latch to the first latch, the data of the node MSB_N in the first latch L1 is transferred to the node LSB_N of the second latch L2. In this case, the data of the node K4 in the first latch L1 is transmitted to the node LSB_N in the second latch L2. That is, the data from the first latch is transmitted to the second latch.

For example, if the page buffer 321 is coupled to a bit line having a failed cell (i.e., the sense node SO is "1"), both of the node LSB_N and the node MSB have data "0" in accordance with a result of step S453. In the case that the node MSB has data "0," the node K4 has data "1". Hence, in the case that the second N-MOS transistor N2 is turned on by transmitting the data transmission control signal DATTRAN having a high level to the second N-MOS transistor N2, the sense node is made to have a high level (data "1").

The sense node SO, in turn, applies a high voltage to the gate of the fourteenth N-MOS transistor N14 and turns on the N-MOS transistor N14. In addition, the second reset signal LSBRST having a high level is provided to the eighth N-MOS transistor N8 and turns on the eighth N-MOS transistor N8. As a result, the node LSB is coupled to the ground node.

Accordingly, the node LSB is converted to a low state, "0," and the node LSB_N is converted to data "1". In the case that the node LSB_N has data "1," it is determined that the corresponding page buffer 321 is a fail.

Hereinafter, the result of the step S455 for a page buffer 321 coupled to a bit line that does not have any failed cell will be described. The precharged voltage level of the sense node SO is discharged to the common source. The sense node has "0."

Both of the node LSB_N and the node MSB have data "1" in accordance with the step S453.

If the node MSB has data "1," the node K4 has data "0". As a result, the sense node SO remains at a low level, and the fourteenth N-MOS transistor N14 is not turned on.

Accordingly, although the second reset signal LSBRST having a high level is transmitted, the node LSB and the node LSB_N maintain data "0" and data "1," respectively. As a result, it is determined that this page buffer 321 is a pass.

The above process is summarized below in Table 1.

TABLE 1

| Node | normal | | | fail | | |
|---|---|---|---|---|---|---|
| operation | LSB_N | MSB | K4 | LSB_N | MSB | K4 |
| initialization | 1 | 1 | 0 | 1 | 1 | 0 |
| Erase verify | 1 | 1 | 0 | 0 | 1 | 0 |
| second latch→first latch | 1 | 1 | 0 | 0 | 0 | 1 |
| first latch →second latch | 1 | 1 | 0 | 1 | 0 | 1 |

As shown in Table 1, the node LSB_N in the page buffer 321 coupled to the failed bit line is inverted unlike that in the page buffer 321 coupled to a normal bit line. Information concerning the fail is stored in the node MSB of the first latch L1.

Accordingly, the test method of the present embodiment controls the flash memory devices on the wafer so that every page buffer 321 is passed after the hard erase verify is performed. The information stored in the first latch L1 may be used as fail information for a following repair process, etc.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of testing a non-volatile memory device, the method comprising:
   performing an erase operation on all of memory cells in a memory cell array of the device;
   performing a first verify operation on all the memory cells;
   storing data of a first latch in a page buffer for storing result in accordance with the first verify operation in a second latch, and setting the data of the first latch to data indicating pass of the verify operation; and
   performing a soft program and a second verify operation about every memory cell.

2. The method of claim 1, wherein a first verify voltage for the first verify operation is smaller than a second verify voltage for the second verify operation.

3. The method of claim 1, wherein an operation of testing power source is performed before the erase operation is performed.

4. The method of claim 1, wherein the step of setting includes:
   providing the data of the first latch for storing the result in accordance with the first verify operation to the second latch; and
   converting the data of the first latch into the data indicating pass of the verify operation.

5. The method of claim 4, wherein the data provided to the second latch is inverted and the inverted data is transmitted to a sense node of corresponding page buffer so as to convert the data of the first latch into the data indicating pass of the verify operation, and the data of the first latch is converted in accordance with voltage level of the sense node.

6. The method of claim 1, wherein the second verify operation is stopped in case that at least one of the memory cells is passed.

7. A method of testing a non-volatile memory device on a wafer comprising:
   performing an erase operation about every memory cell in the non-volatile memory device and a first verify operation using a first latch in corresponding page buffer;
   transmitting data stored in the first latch to a second latch in the page buffer through a sense node in the page buffer;
   setting data of the second latch to data indicating verify pass result; and
   performing a soft program about the memory cells and a second verify operation.

8. The method of claim 7, wherein a process of testing power source is performed before the erase operation is performed.

9. The method of claim 7, wherein the data of the second latch is transmitted to the first latch through the sense node so as to set the data indicating the verify pass result to the second latch.

10. The method of claim 7, wherein a first verify voltage for the first verify operation is smaller than a second verify voltage for the second verify operation.

11. The method of claim 7, wherein a repair operation is performed by using the data of the first latch in accordance with the step of transmitting.

12. The method of claim 7, wherein the second verify operation is stopped in case that at least one of the memory cells is passed.

* * * * *